(12) United States Patent
Edelstein et al.

(10) Patent No.: US 6,501,268 B1
(45) Date of Patent: Dec. 31, 2002

(54) MAGNETIC SENSOR WITH MODULATING FLUX CONCENTRATOR FOR 1/F NOISE REDUCTION

(75) Inventors: Alan S. Edelstein, Alexandria, VA (US); David M. Hull, Adelphi, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 12 days.

(21) Appl. No.: 09/641,370

(22) Filed: Aug. 18, 2000

(51) Int. Cl.$^7$ .......................... G01R 33/02; G01R 33/06
(52) U.S. Cl. ...................... 324/244; 324/225; 324/251; 324/252; 324/259
(58) Field of Search .................. 324/225, 244–260, 324/117 R, 117 H, 345; 33/355 R, 356, 357, 363 R; 338/32 R, 32 H; 600/409

(56) References Cited

U.S. PATENT DOCUMENTS

| | | | | |
|---|---|---|---|---|
| 4,587,509 A | * | 5/1986 | Pitt et al. ................. | 324/251 X |
| 4,692,703 A | * | 9/1987 | Extance et al. ............. | 324/251 |
| 4,864,237 A | * | 9/1989 | Hoenig ....................... | 324/248 |
| 4,916,821 A | * | 4/1990 | Potter ......................... | 33/362 |
| 5,260,653 A | * | 11/1993 | Smith et al. ................. | 324/252 |
| 5,493,220 A | * | 2/1996 | Oliver et al. ........ | 324/244.1 X |
| 5,942,895 A | * | 8/1999 | Popovic et al. ............. | 324/251 |

* cited by examiner

*Primary Examiner*—Gerard R. Strecker
(74) *Attorney, Agent, or Firm*—Paul S. Clohan, Jr.; Edward L. Stolarun

(57) ABSTRACT

A magnetic sensing device that senses low frequency magnetic fields by using movable flux concentrators that modulate the observed low frequency signal. The concentrator oscillates at a modulation frequency much greater than the observed magnetic field being sensed by the device. The modulation shifts this observed signal to higher frequencies and thus minimizes 1/f-type noise. This is preferably accomplished by the oscillatory motion of a microelectromechanical (MEMS)—type magnetic flux concentrator operated with a magnetic sensor, preferably made on a common substrate. Such a combined device can be used in a magnetometer. Such a device is small, low-cost and has low-power-consumption requirements. The magnetic sensor can be a Hall effect or other type of magnetic sensor. At least one modulating flux concentrator is used with the magnetic sensor.

20 Claims, 8 Drawing Sheets

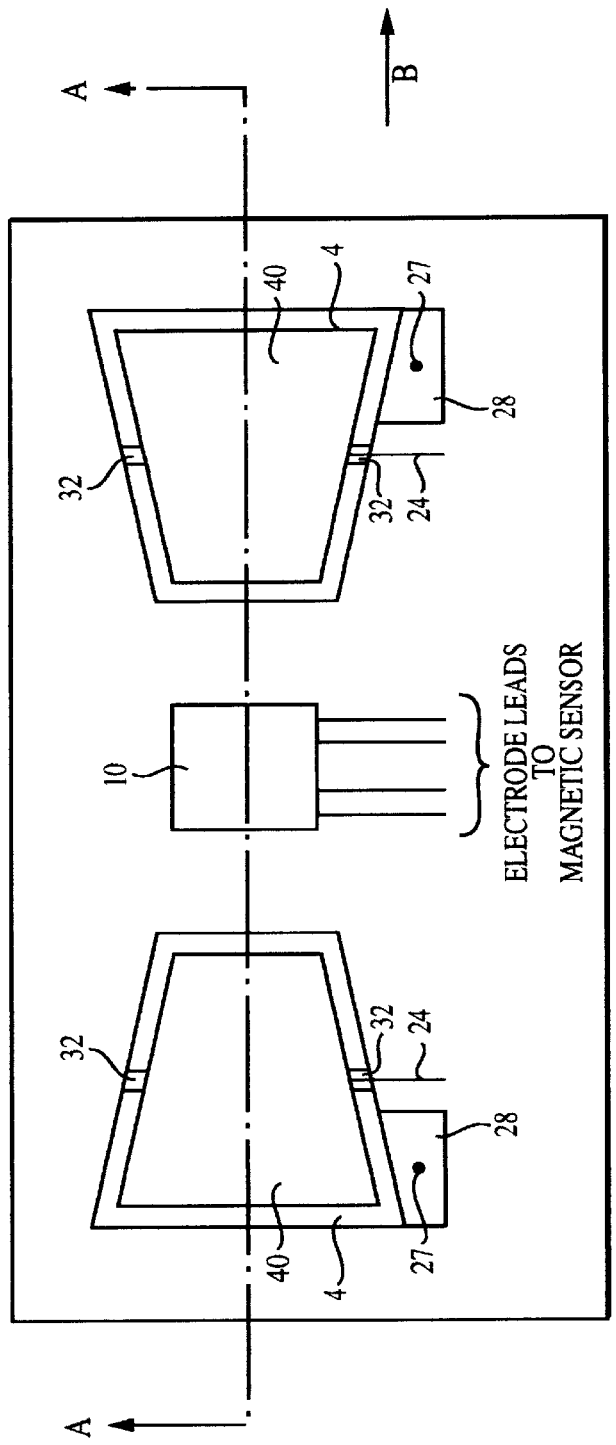
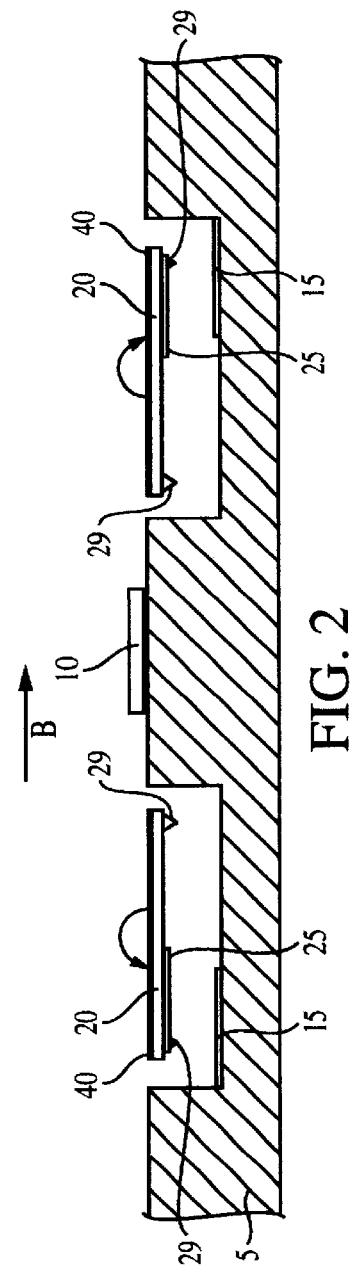

MAGNETIC SENSOR WITH MODULATING FLUX CONCENTRATOR FOR 1/F NOISE REDUCTION

STATEMENT OF GOVERNMENT INTEREST

The invention described herein may be manufactured and used by or for the United States Government for Governmental purposes without the payment of any royalties thereon.

FIELD OF THE INVENTION

The present invention relates generally to magnetic transducers, and more particularly, to magnetic sensors used with a flux concentrator that modulates the magnetic flux going to the magnetic sensor.

BACKGROUND OF THE INVENTION

Interest is increasing in the development of miniature magnetic sensors for sensing low-frequency magnetic fields in terrestrial, extraterrestrial, industrial, biomedical, oceanographic, and environmental applications. The trend in magnetic sensor design and development is constantly toward smaller size, lower power consumption, and lower cost for similar or improved performance.

There are several types of magnetometers (magnetic sensors with external instrumentation) currently used. The least expensive and least sensitive devices have resolution of about $10^{-1}$ Oersted (Oe)/Hz$^{1/2}$ and typically are Hall effect devices. These devices work by sensing a voltage change across a conductor or semiconductor placed in a magnetic field. Such devices are insensitive and do not lend themselves to applications requiring greater sensitivity, such as that required in brain scan devices and magnetic anomaly detection devices. Magnetoresistive-type magnetic sensors are suited for low-cost, medium-sensitivity applications and have a resolution of about $10^{-5}$ Oe/Hz$^{1/2}$. Using spin-dependent tunneling magnetoresistive sensors, one can observe 38% changes in the resistivity in fields of a few Oe, see D. Song, J. Nowak & M. Covington, J. Appl. Phys, 87, 5197 (2000).

More sensitive magnetometers exist, but they are typically limited to applications that can tolerate relatively high power size, weight and cost. The most common of these devices are flux gate magnetometers that have a resolution of approximately $10^{-6}$ Oe/Hz$^{1/2}$ and SQUID (superconducting quantum interference device) magnetometers that have a resolution of about $10^{-10}$ Oe/Hz$^{1/2}$. Flux gate magnetometers use a magnetic core surrounded by an electromagnetic coil, and are difficult to microfabricate. Additionally, flux gate magnetometers require relatively large amount of power and accordingly do no lend themselves to low-cost, compact, portable design. Though SQUID magnetometers are the most sensitive magnetometers, the apparatus must include a means for cooling to cryogenic temperatures. This makes SQUID magnetometers extremely bulky and expensive to operate. Their size limits their utility because the active superconducting element cannot be placed directly adjacent to the source of the magnetic field, for example the brain. Accordingly, there is need for small, inexpensive, low power magnetometers that have sufficient sensitivity to be useful for a variety of magnetometer applications at low frequencies.

Magnetic sensors used to detect objects that move slowly typically exhibit considerable low-frequency 1/f-type noise (where f is frequency of operation of the magnetic sensor), an unwanted condition. In general, there is a tendency for such devices that have higher sensitivity to also exhibit higher 1/f-type noise. This generally occurs when using magnetoresistive-type magnetic sensors, see van de veerdonk et al. J. Appl. Phys 82, 6152 (1997).

A well-known way of increasing the sensed magnetic field by a magnetic sensor is by use of a flux concentrator, which can enhance a sensed magnetic field by as much as a factor of 50, see N. Smith et al., IEEE Trans. Magn. 33, p. 3358 (1997). An example of such a device is taught in U.S. Pat. No. 5,942,895, entitled "Magnetic field sensor and current and/or energy sensor," that use Hall sensors with flux concentrator components. The magnetization of flux concentrators increases in the direction of the field to be measured. This in turn increases the magnetic field flux at the position of the sensor and, thus, increases the output signal from the magnetic sensor.

The magnetization of the flux concentrator can change by domain wall motion or domain rotation. The latter is the preferred mode because it generates less 1/f noise. There are many different ways and materials that can used for the magnetic material. The overall objective is the largest possible increase in the magnetic field at the position of the sensor without increasing the magnetic 1/f noise.

A magnetic sensor (magnetometer) that addresses 1/f-type noise is taught in U.S. Pat. No. 4,864,237. This disclosure teaches of an apparatus for measuring magnetic fields, which change only at extremely low frequency. This apparatus uses a SQUID magnetometer that includes a superconducting flux transformer that inductively couples a detected signal into a d-c SQUID sensor. This magnetometer can optionally include a device for modulating the detected signal in a frequency range characteristic of low-noise operation of the SQUID. The modulation frequencies are generally above 1 Hz and optionally even above 1-kHz. Limitations of this device include need for cryogenic operation, which inherently do not lend themselves to relatively low cost, low power use.

Thus, there is need, for small, low-cost, low-power-consuming magnetic sensors having sensitivities capable of meeting the varied applications listed above for detecting low frequency signals and minimizing the 1/f-type noise.

OBJECTS AND SUMMARY OF THE INVENTION

It is therefore an object of this invention to provide a magnetic sensor with a modulating flux concentrator having sufficient sensitivity for a variety of applications that minimize effects of 1/f-type noise.

It is a further object of this invention to provide such a magnetic sensor with a modulating flux concentrator that is inexpensive to manufacture, has a high sensitivity, yet not having to be concerned with 1/f-type noise associated with that type of sensor. Such devices can preferably be produced by microfabrication MEMS-techniques.

It is a further object of this invention to provide such a magnetic sensor with a flux concentrator that uses relatively little power. An example would be a magnetic sensor with a flux concentrator that can be operated for long periods of time from batteries.

This invention results from the realization that a small and inexpensive yet extremely sensitive magnetic sensor, may be accomplished by oscillating a torsionally suspended flux concentrator or a flux concentrator that can rotate or oscillate about an axis.

The invention improves the sensitivity of magnetic sensors in general that operate at low frequencies by using flux concentrators that modulate an observed sensed, low-frequency, magnetic field, thereby shifting this observed field to higher frequencies where the noise of the sensor is smaller to minimize 1/f-type noise. This is preferably accomplished by providing a torsionally suspended microelectromechanical (MEMS)-type magnetic flux concentrator or a flux concentrator that can rotate or oscillate about some axis in combination with a magnetic sensor, preferably on a common substrate. Such a combined device is used in a magnetometer. Such a device is small, low-cost and has low-power-consumption requirements. The magnetic sensor can be a Hall effect or other type of magnetic sensor. At least one torsionally suspended or free-to-rotate MEMS-type fabricated flux concentrator is used with the magnetic sensor. The torsionally-suspended flux concentrator or a flux concentrator that can rotate or oscillate about some axis at a modulation frequency much greater than an observed lower frequency signal being sensed.

The signal to noise ratio is improved by this modulation technique if the flux concentrator has less 1/f noise than the magnetic sensor. Since flux concentrators are much simpler devices than magnetic sensors, there are fewer constraints in decreasing their 1/f noise. Several ways of making low noise flux concentrators are discussed herein. Thus, it should be possible to satisfy the condition that the 1/f noise is lower in the flux concentrator than in the magnetic sensor.

BRIEF DESCRIPTION OF THE DRAWINGS

The foregoing and other features, and advantages of the invention will be apparent from the following more particular description of the preferred embodiments of the invention, as illustrated in the accompanying drawings, wherein:

FIG. 1 shows a plan view of the invention of a modulating flux concentrator made using MEMS fabrication techniques that operates in combination with a magnetic sensor.

FIG. 2 shows FIG. 1 in cross-section along line A—A.

DETAILED DESCRIPTION OF THE PREFERRED EMBODIMENTS

Figure 3A:
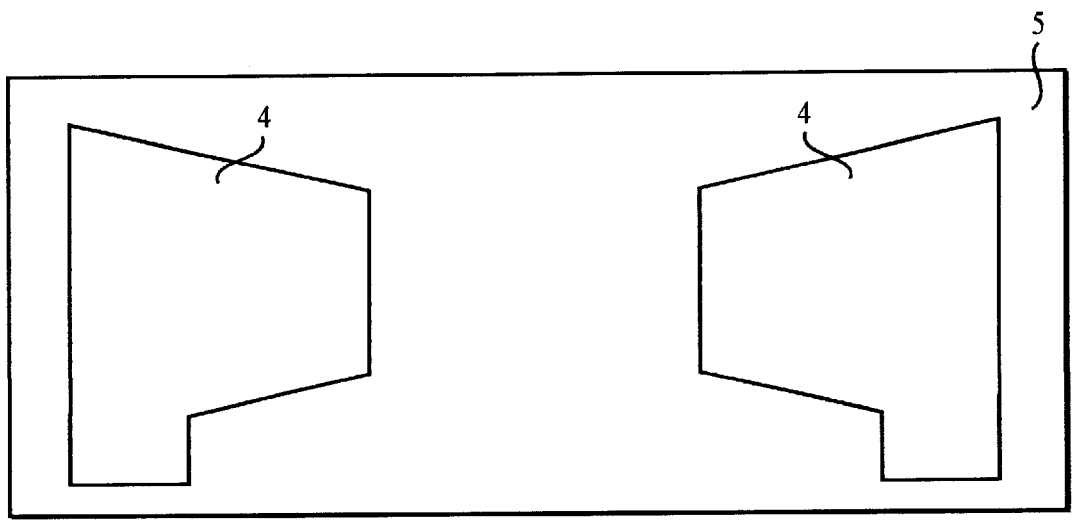
FIGS. 3a, 3b, 3c, 3d, 3e, 3f and 3g show the preferred processing steps involved in making the invention.

Referring to FIGS. 1 and 2, an exemplary form of the device using the concepts of the invention is shown that includes a magnetic sensor 10 with two flux concentrators 40 that can oscillate about an axis 32. Each flux concentrator 40 increases the sensed magnetic flux density at the position of the sensor 10 when the flux concentrators are in the horizontal position, i.e., the plane of the substrate. A layered material forming part of the flux concentrator 40 can comprise a thick film of a soft ferromagnetic material with a large permeability. In preferred form, the sensor 10 comprises films deposited on a silicon substrate 5. The flux concentrators 40 are deposited on polysilicon flaps 20. Modulation of a sensed magnetic signal at the magnetic sensor 10 is accomplished by using torsionally suspended flux concentrator members 40 that oscillate about a torsion member 32 or perform oscillatory rotation about an axis 32. The polysilicon flaps 20 and torsion members 32 are formed using microelectromechanical systems (MEMS) fabrication techniques. In the magnetometer, the flux concentrators on the polysilicon flaps are driven electrostatically to oscillate at a modulating frequency $f_m$ about the member 32 that stably retains the concentrators above the recesses 4 and allow it to oscillate. When these concentrators 40 are in a middle (flat) position (shown in FIG. 2), the sensed magnetic flux is concentrated at the magnetic sensor 10.

In operation, when the flux concentrators 40 are rotated to the up and down positions (the edges closest to the sensor 10 are raised and lowered above the substrate) and the concentrated magnetic field is deflected away from the sensor 10. In these positions, there is minimal enhancement of the flux field sensed by the magnetic sensor.

FIG. 2, shows in cross-section along line A—A of FIG. 1, wherein a magnetic field sensor 10, which preferably uses a Hall effect device or a magnetoresistive type magnetic sensor, and the two magnetic flux concentrators 40 are shown for strengthening a magnetic field at the position of the sensor 10 in the direction B. Accordingly, the concentrated magnetic field is greatest when the concentrators 40 are substantially aligned with the magnetic sensor 10 as shown in FIG. 2. The dimensions of the flux concentrators 40 in FIG. 1 typically encompass gross dimensions of 100 by 75 microns, while the thickness of the concentrators is typically around 2 to 15 micrometers. Electrode pads 15 are deposited in the recesses 4 of the substrate 5. Other matching electrode pads 25 are deposited on the underside of the polysilicon flaps 20. The electrical connections to the electrode pads 25 on the bottom of the polysilicon flaps 20 are made by coating the torsional suspension member 32 with a conductor 24. The electrical connection to an extension 28 of the bottom electrode 15 pad is made by a via 27. The bottom electrode pad 15 extends to a region outside the recess 4. Each of the electrode pads 25 has a protuberance 29 extending therefrom to minimize the electrode pad surface area and thereby minimize the possibility of a sticking surfaces problem.

The torsional or pivotal oscillating motion of the polysilicon flaps 20 about the torsional suspension 32 or the axis of rotation is driven electrostatically at a frequency $f_m$, by applying an AC voltage from a signal generator (not shown) between the electrode pads 15 and 25. These pads are on both the polysilicon flaps 20 and in each of the wells 4 of the substrate 5. Driving the motion from the signal generator requires very little power. This is especially true if the drive frequency is set equal to the mechanical resonant frequency of the suspended polysilicon flaps 20 containing the flux concentrators 40. By using the resonant frequency, one obtains the largest amplitude for the oscillations using the least power. The magnetic field generated by the small currents of the exciting electrostatic modulating signal is negligible. Since electrostatically driven oscillatory motion of MEMS devices is often used (Proceedings IEEE Thirteenth International Conference on Micro Electro Mechanical Systems) in MEMS technology, it will not be described further here.

The oscillatory or rotational motion of the flux concentrators 40 modulates the magnetic flux sensed by the magnetic sensor at the frequency $f_m$. In general, the motion of the flux concentrator can decrease the field in the sense direction at the position of the sensor 10 in the following three ways. The motion can (1) increases the distance between the flux concentrator and the sensor, (2) rotate the vector direction of the flux away from the sense direction, and (3) break up an easy flux path in the flux concentrator thus decreasing the enhancement of the field. Different methods for modulating the flux at the position of the magnetic sensor are described below in the section titled "Alternative Methods". By modulating the flux using the motion of the flux concentrators 40 at this frequency $f_m$, the operating frequency of the sensor is shifted to this new frequency. One then detects the signal using the magnetic sensor 10 and amplifies the signal in a relatively narrow frequency band around this higher frequency where the 1/f noise of the sensor is low. By doing this one avoids the much larger 1/f noise inherent at low frequencies in magnetoresistive sensors and many other magnetic sensors A desired observed signal that occurs at low frequencies can be obtained from the magnetic sensor by demodulating the output of an amplifier forming part of a magnetometer.

The magnetic sensor 10 as shown, can be a Hall-effect device wherein four leads are required. Other types of Hall effect devices, which typically have a rectangular geometry with current or voltage electrodes arranged on each side of a rectangle. It is also possible to use Hall devices in which three or all four electrodes are arranged on one side of the rectangle, see U.S. Pat. No. 5,057,890. When a Hall effect device is used, an output voltage from such a device results from the Lorentz force of the magnetic field acting on charge carriers within such a device. Other types of magnetic sensors that can be used other than Hall effect devices include magnetoresistive sensors that include giant magnetoresistive sensors, spin dependent tunneling sensors, and bismuth, magnetostrictive sensors, and some MEMS sensors.

When the magnetic sensor 10 is a magnetoresistive element, a Wheatstone electrical bridge configuration is typically used to interface with the magnetic sensor. When the resistance of the magnetoresistive element changes because of a magnetic field, the bridge output voltage changes. The change in the bridge output is increased by using the flux concentrator. The bridge output voltage is modulated at a frequency $f_m$, typically the resonant frequency of the suspended polysilicon flaps 20, by the motion of the MEMS flux concentrators 40. The signal can then be amplified by a narrow band amplifier and then demodulated. The bandwidth of the amplifier only has to be broad enough to include the low frequencies in the original signal coming into the MEMS flux concentrator.

ALTERNATIVE METHODS

The overall objective is the largest possible modulation of the flux in the sense direction at the position of the sensor. Furthermore, it is desirable to minimize the field at the position of the magnetic sensor 10 in the absence of the field to be measured. There are several different ways and geometries for making the magnetic material of the flux concentrators 40 and different geometries that can be used for the polysilicon flaps 20 that can be used to reach these objectives.

In its simplest form the flux concentrator consists of just a single layer of a soft ferromagnetic material. Alternatively, the flux concentrators 40 can be constructed in multiple layers. These layers can comprise a hard magnetic material and a soft magnetic material layer with equal magnitude magnetizations separated by a spacer layer. In zero applied field, the magnetizations of both the hard material and the soft material should be perpendicular to the field measuring direction B and directed opposite to one another. Thus, in the absence of an applied field, the fields due to the soft and hard material should approximately cancel one another at the position of the sensor.

There is a tendency for the directions of magnetization of these two materials to be antiparallel because this minimizes their magnetostatic energy. One does not want the force (either magnetostatic or due to magnetic anisotropy) that tends to maintain the antiparallel configuration to be very strong because this limits the amount of domain rotation when a magnetic field is applied. When a magnetic field H is applied in the field measuring direction, the magnetization of the soft material increases in the field measuring direction. This occurs preferably by domain rotation. Domain rotation generates much less noise compared to domain wall motion. The amount of domain rotation is equal to AH where A is a function of the properties of the material (such as the anisotrophy) which increases if the restoring torque is smaller. This rotation will enhance the magnetic flux at the position of the sensor by an amount proportional to the angle of rotation and the magnetization of the soft magnetic material.

The layer of the soft magnetic material can be a composite of single domain magnetic particles and a nonmagnetic material. By restricting magnetic materials to be composed of single domain particles, the magnetization within such materials can only change by domain rotation and not domain wall motion. Particles of Permalloy that are roughly larger than 10 nm will be single domain and not superparamagnetic. It is still required that the magnetizations of the soft magnetic material and the hard magnetic material cancel in the absence of an external field.

A design can be used wherein the edges of the flux concentrators 40 are modified to decrease the magnetic noise. This can preferably be done by treating the edges of the soft magnetic material of the flux concentrators 40 so that they have slightly higher coercivity than the center. This improves the magnetic response. The rest of the flux concentrator preferably includes a similar three-layer structure with similar arrangement of the magnetizations as described above. The directions of the magnetization can be obtained by processing the flux concentrator in a magnetic field. This overall geometry maximizes the response of the flux concentrator to a field that is applied in the field measuring direction B.

As stated earlier, the motion of the flux concentrator can decrease the field in the sense direction at the position of the sensor 10 in the following three ways. The motion can (1) increases the distance of flux concentrator from the sensor, (2) rotate the direction of the flux lines away from the sense direction, and (3) break up an easy flux path in the flux concentrator thus decreasing enhancement of the field. Variations to the preferred for the geometry of the flux concentrator discussed below can decrease the field at the sensor by all three of these ways.

Figure 4:
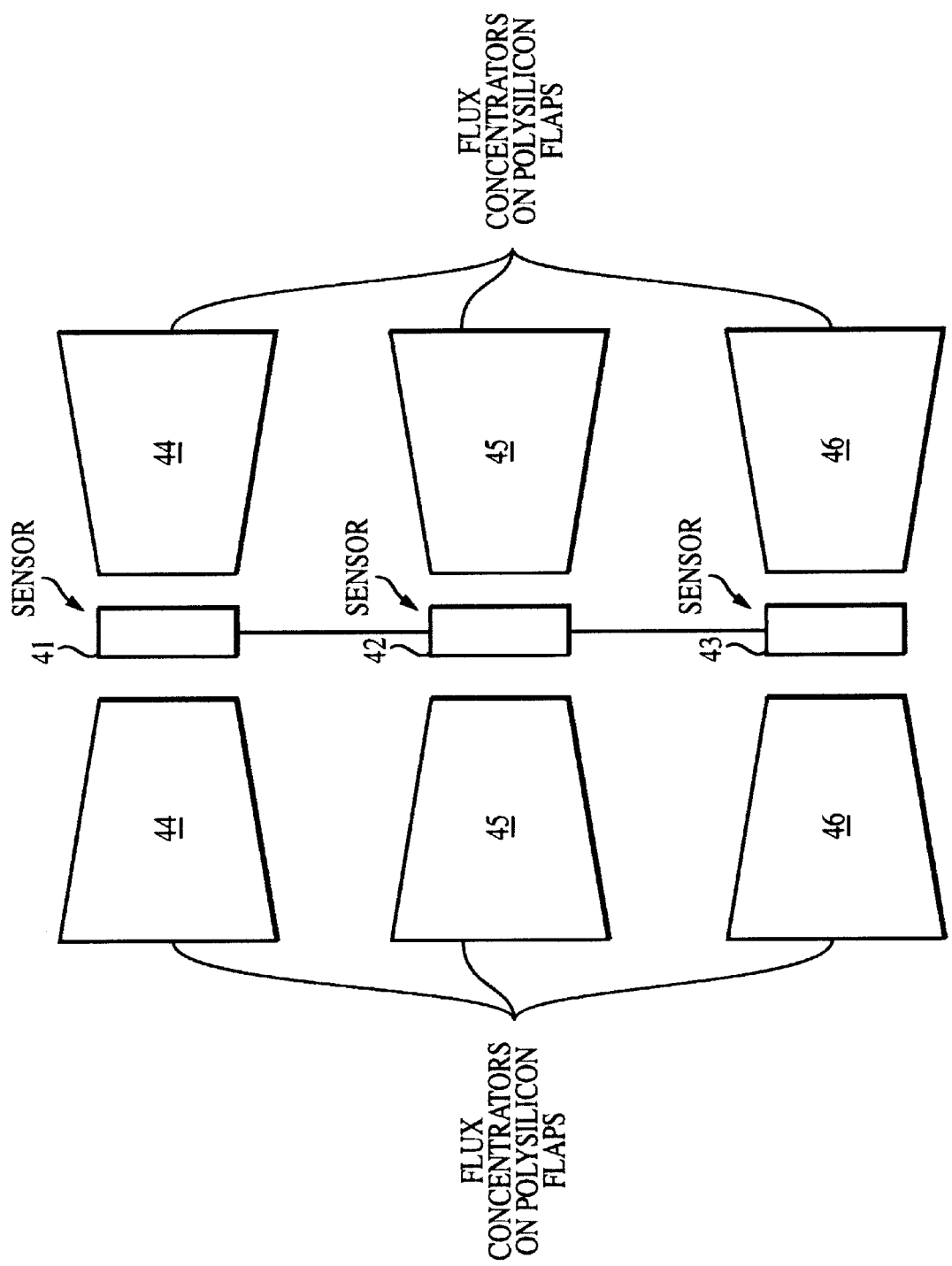
FIG. 4 shows using several modulating flux concentrators and magnetic sensors connected in series.

FIG. 4 shows putting several sensors 41, 42 and 43, each with its own modulating flux concentrator 44, 45 and 46 in series to increase the output signal. By doing this each of the polysilicon flaps can be kept small and, thus, the mechanical resonant frequency can be kept large.

Figure 5:
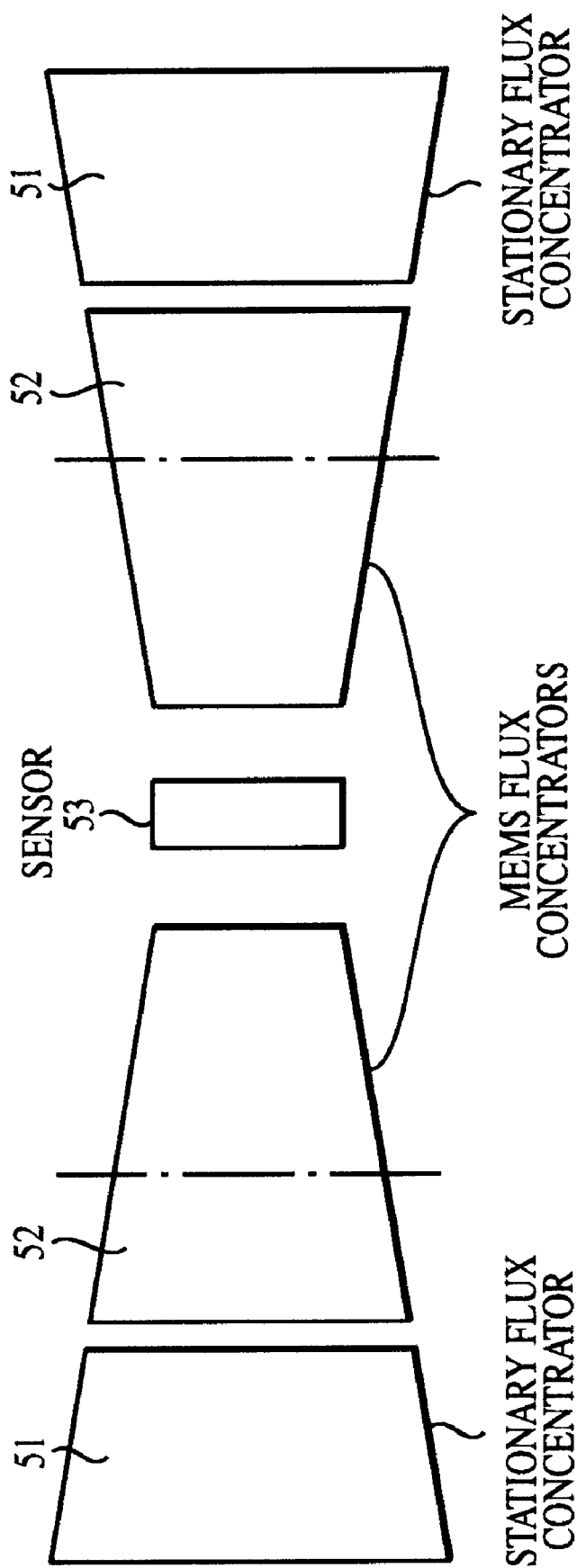
FIG. 5 shows flux concentrators composed of a stationary outer part that increases the flux and an inner part that increases the flux and also modulates the flux.

Another method of using the invention, shown in FIG. 5 is to separate some of the functions. For example, the flux concentrator can be composed of two parts 51 and 52 that operate together in a serial manner on a sensed field. A first flux part 51 would not move and be configured to be in the path of the incoming magnetic flux and be further from the magnetic sensor 53 than the second flux part 52. This first part 51 would be designed to increase the magnetic flux without appreciably increasing the 1/f-type noise. A second flux concentrator 52 configured therewith would be closer to the sensor and do the modulation. As before, the signal due to the modulating field is in narrow frequency band around the modulation frequency and not at low frequencies where most sensors have a considerable amount of 1/f noise. The modulation frequency would preferably be the mechanical resonant frequency of the modulating flux concentrator 52.

Figure 6A:
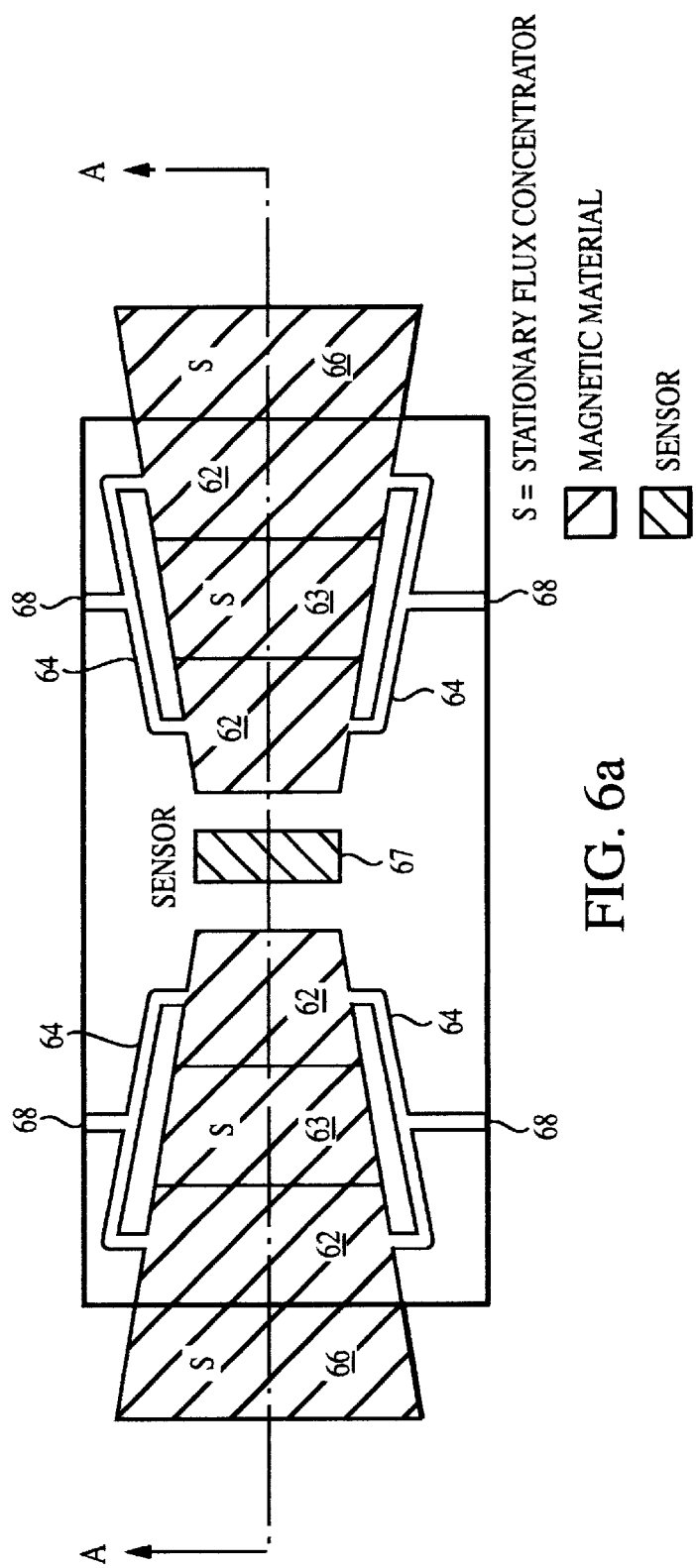
FIGS. 6a and 6b show a flux concentrator composed of stationary and moving parts that creates a large amplitude modulation signal at the position of the sensor.
Figure 6B:
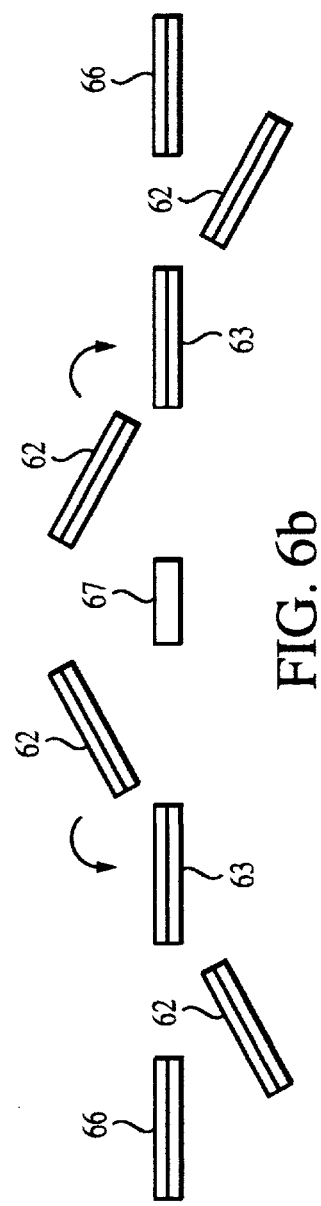

FIGS. 6a and 6b show another geometry for modulating the magnetic flux. There are two polysilicon frames 64 that can oscillate about torsional suspensions 68. There is a center region inside each frame that is stationary 63. The magnetic material of a flux concentrator are deposited in the cross hatched regions 62, 63, and 66. This way of modulating the flux has the advantages of breaking up the flux path on a relatively fine scale near the sensor while still moving the flux concentrator a relatively large distance from the sensor 67 when the rotation angle theta is large.

Figure 7:
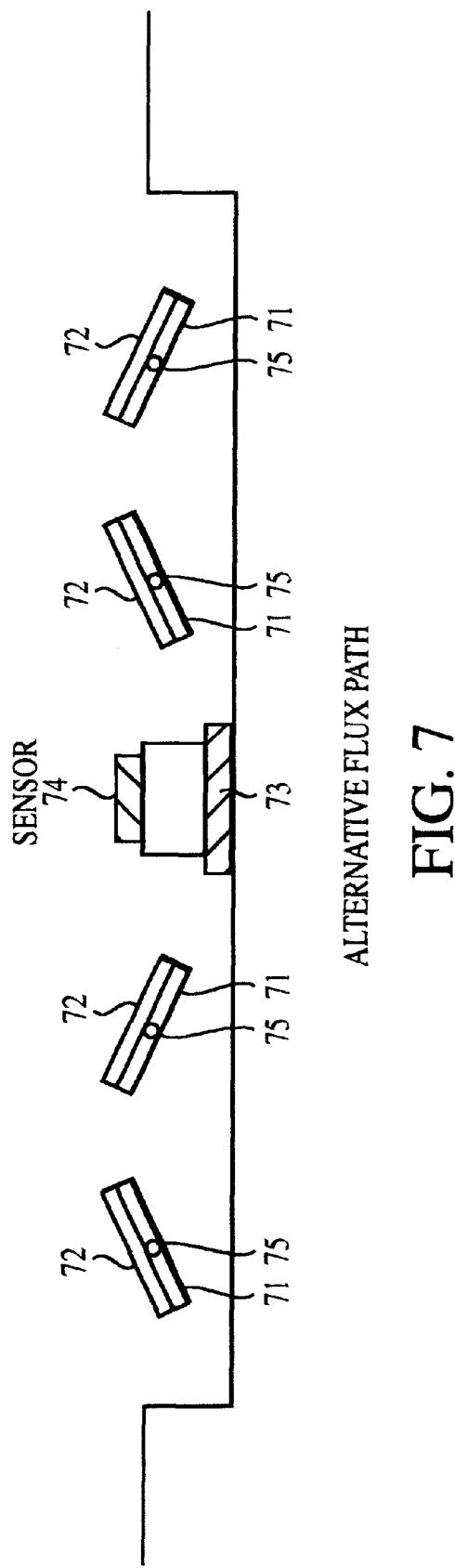
FIG. 7 shows a modulating flux concentrator that provides an alternative flux path around the sensor.

FIG. 7 shows a way of creating an easy flux path around the sensor 74. In this form of the device, the polysilicon flaps 71, that are coated with suitable magnetic material 72, can rotate about torsional suspensions 75. Layer 73 is composed of a soft magnetic material. When the flaps 71 are in the positions shown in FIG. 7 there is an easy path around the sensor 74 and the flux at the position of the sensor is small.

Multiple flux concentrator members can also be incorporated in a design if the magnetic sensor is sensitive to the magnitude of the magnetic field and not the direction of the magnetic field.

METHOD OF MAKING THE TRANSDUCER: The invention is preferably fabricated by MEMS processing techniques. Such techniques are addressed by LIGA (LIthographie, Galvanoformung, Abformung, for "lithography, electroplating, molding") micromachining processing methods that use metals, polymers and even ceramics for the production of varied microstructured devices having extreme precision. These collective microstructures are referred to as MEMS-type devices that are alternatives to conventional discrete electromechanical devices such as relays, actuators, and sensors. When properly designed, MEMS-type devices produce useful forces and displacement, while consuming reasonable amounts of power.

Figure 3B:
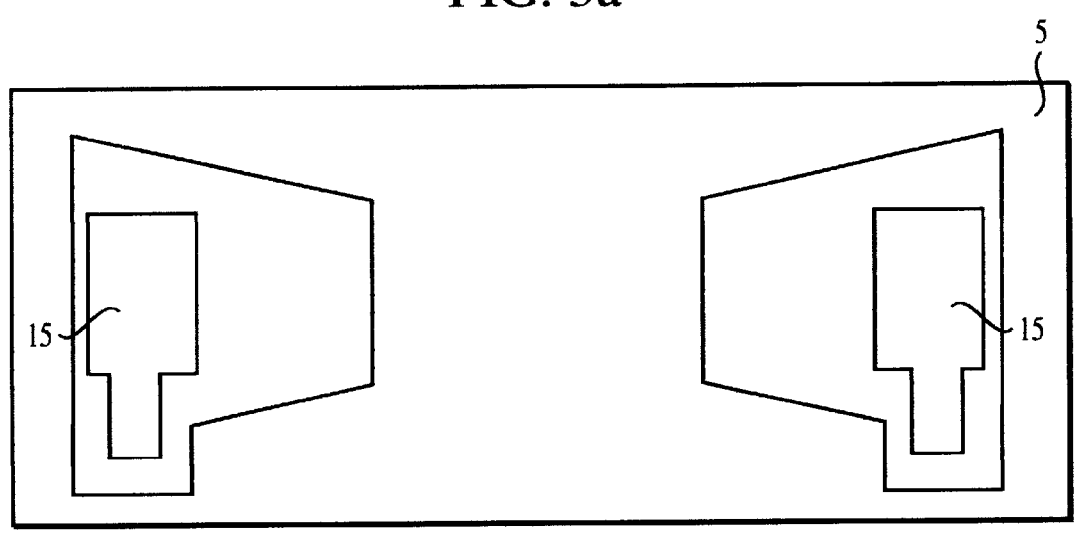
Figure 3C:
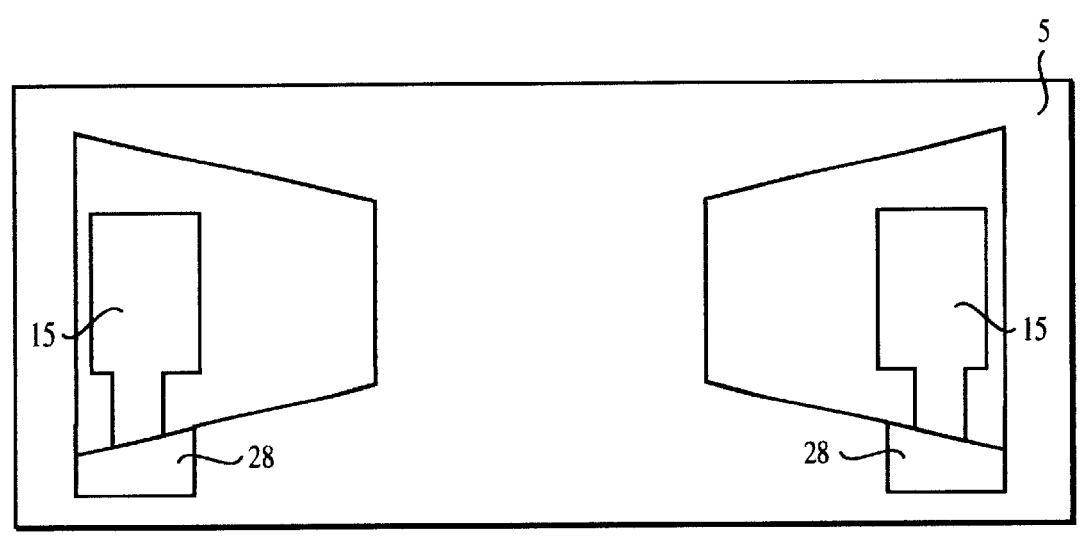
Figure 3D:
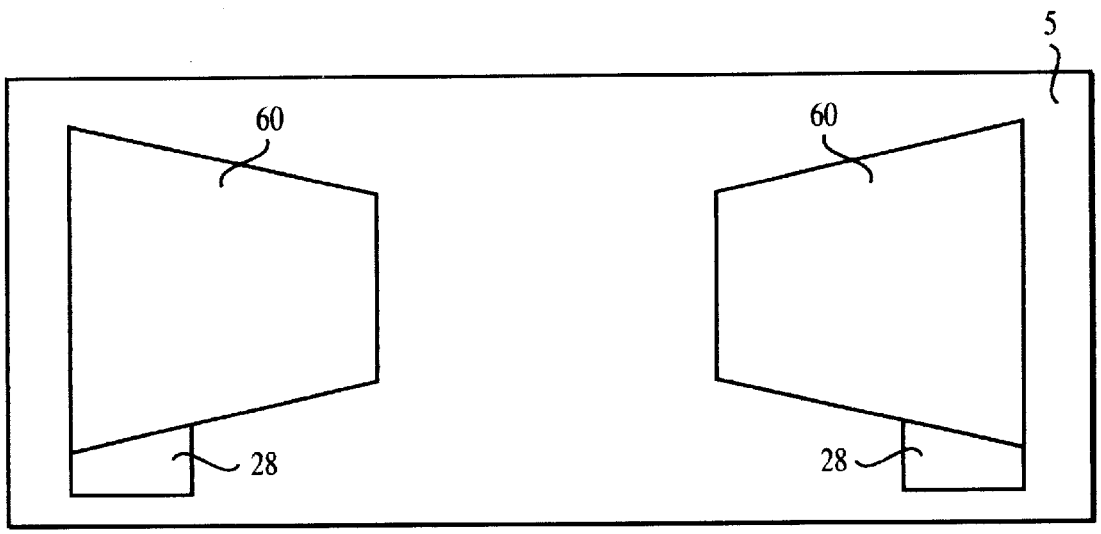
Figure 3E:
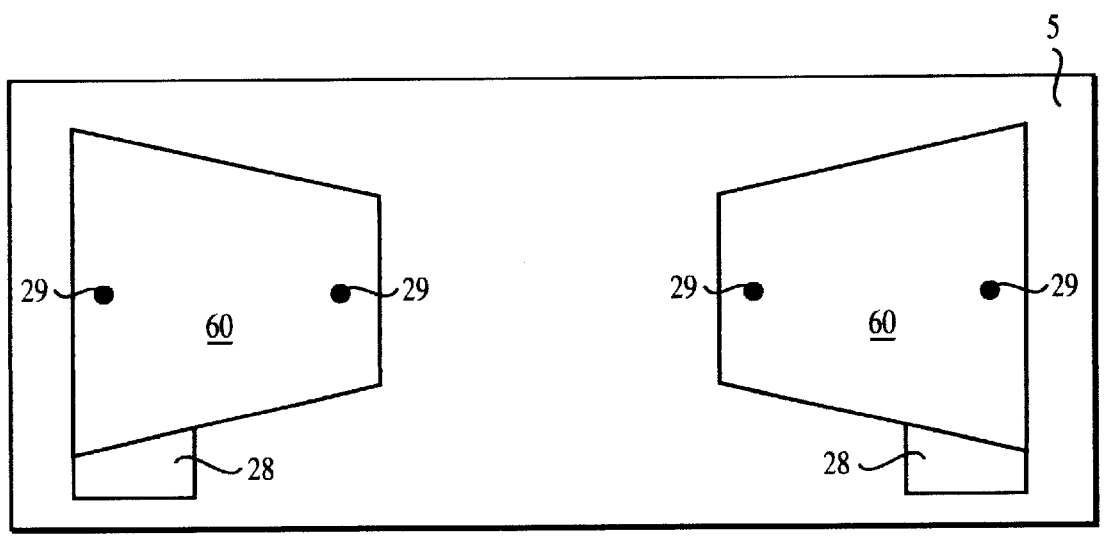
Figure 3F:
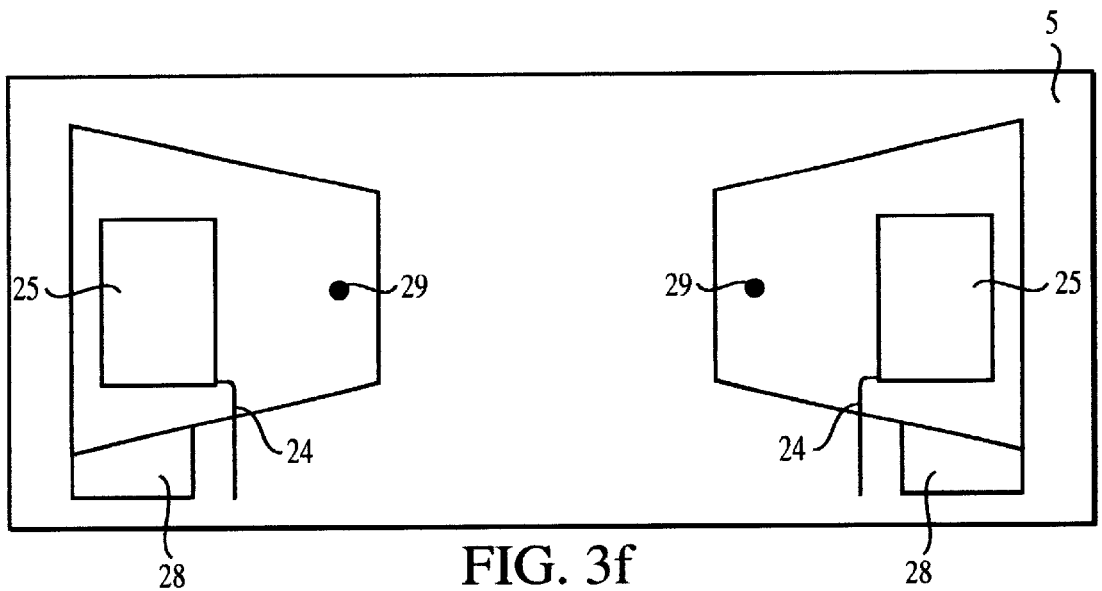
Figure 3G:
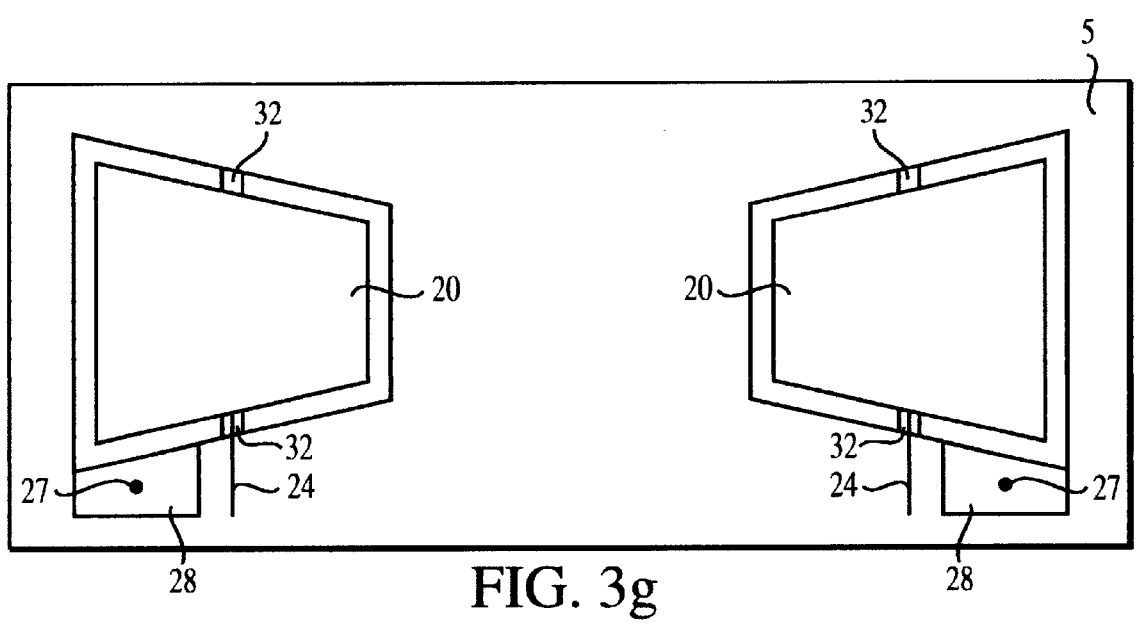

Current LIGA processes create features whose top surface is as much as 200-microns above the substrate. Any technology may be used to form the device, whether a LIGA-type process or a bulk plasma micromachining technique such as RIE (reactive ion etching), or a surface micromachining technique using standard photolithography and etching processes yielding the desired configurations. Preferably, each flux concentrator 40 is fabricated on a die that in an extreme case might be as large as one square centimeter, but is more likely to be less than 1 mm$^2$ in area and about 2 to 50 microns thick. As mentioned above, preferably, each device is implemented on a single silicon chip or die, but multiple dies also can be used. In a preferred embodiment of the invention, the device is monolithic in its basic configuration. MEMS devices can be readily integrated and interfaced with electronics because they are fabricated much the same way as integrated circuits. The specific MEMS fabrication technique requires only that desired geometries and mechanical and electrical performance characteristics are obtained. The preferred processing steps are as follows and illustrated in FIGS. 3a–3g:

1. Use lithography to define the edge of the recesses 4 as depicted in FIG. 3a.
2. Etch out these recesses 4.
3. Deposit the bottom electrodes 15 and as depicted in FIG. 3b.
4. Deposit polisilicon 28 to partially cover bottom electrodes 15 as depicted in FIG. 3c
5. Deposit a sacrificial material 60 in the recesses 4 as depicted in FIG. 3d.
6. Deposit polysilicon bumps 29 and more sacrificial material 60 as shown in FIG. 3e.
7. Deposit the top electrodes 25 and the connections 24 to the top electrode as depicted in FIG. 3f.
8. Deposit polysilicon flaps 20 and torsional suspension member 32 as depicted in FIG. 3g.
9. Make a via 27 through polysilicon 28 to provide an electrical connection to the bottom electrodes 15 as depicted in FIG. 3g.
10. Next, deposit the flux concentrators 40 on top of the polysilicon flaps. The flux concentrator can be a trilayer film or more complicated structure as required.
11. Remove the sacrificial material 60.

The polysilicon bumps 29 prevent sticking if the top electrodes 25 tend to touch the bottom electrodes 15 or polysilicon flaps 20 tend to touch the bottom of the recesses 4.

Although the description above contains many specificities, these should not be construed as limiting the scope of this invention as set forth in the appended claims, but as merely providing illustration of the presently preferred embodiment of this invention.

We claim:

1. A modulating magnetic field transducer comprising:
   a base structure;
   a magnetic sensor attached to said base structure for sensing a magnetic field;
   a flux concentrator proximate to said magnetic sensor;
   support means on said base structure for enabling said flux concentrator to assume a repetitive movement;
   a pair of complementary electrodes for said flux concentrator including a first electrode attached to said base structure in opposition to a corresponding second electrode that is attached to said flux concentrator such that when said pair of complementary electrodes are excited by a modulating electrical signal, said flux concentrator moves at a prescribed frequency to modulate the magnetic field at the magnetic sensor and shift the frequency of the magnetic field that is sensed by the magnetic sensor to a higher frequency to thereby minimize 1/f-type noise, where f is the frequency of operation of the magnetic sensor.

2. The transducer of claim 1 wherein said movement of said flux concentrator comprises oscillatory movement.

3. The transducer of claim 1 wherein said movement of said flux concentrator comprises rotary movement.

4. The transducer of claim 1 wherein said movement of said flux concentrator comprises displacement.

5. The transducer of claim 1 wherein said magnetic sensor comprises a Hall effect type sensor.

6. The transducer of claim 1 wherein said magnetic sensor comprises a magnetoresistive sensor.

7. The transducer of claim 6 wherein said magnetoresistive sensor comprises a bismuth-based material.

8. The transducer of claim 1 wherein said magnetic sensor comprises a magneto-diode.

9. The transducer of claim 1 wherein said magnetic sensor comprises a magneto-transistor.

10. The transducer of claim 1 wherein said magnetic sensor comprises a MAGFET.

11. The transducer of claim 1 wherein said magnetic sensor comprises a fluxgate.

12. The transducer of claim 1 wherein said magnetic sensor comprises a miniature fluxgate magnetometer.

13. The transducer of claim 1 wherein said magnetic sensor comprises a SQUID.

14. The transducer of claim 1 wherein said magnetic sensor comprises a magneto-optical sensor.

15. A microelectromechanical modulating magnetic field transducer comprising:

a base structure;

a plurality of magnetic sensors attached to said base structure for sensing a magnetic field;

a like plurality of flux concentrators on either side of said plurality of magnetic sensors;

support means on said base structure for enabling each of said flux concentrators to assume repetitive movement;

a pair of complementary electrodes for each flux concentrator, each pair of complementary electrodes including a first electrode attached to said base structure in opposition to a corresponding second electrode that is attached to said flux concentrator such that when said pair of complementary electrodes are excited by a modulating electrical signal, each flux concentrator moves at a prescribed frequency to modulate the magnetic field at the magnetic sensors and shift the frequency of the magnetic field that is sensed by the magnetic sensors to a higher frequency to thereby minimize 1/f-type noises where f is the frequency of operation of the magnetic sensor.

16. A microelectromechanical modulating magnetic field transducer comprising:

a base structure;

a magnetic sensor attached to said base structure for sensing a magnetic field;

a moveable flux concentrator on either side of said magnetic sensor;

a stationary flux concentrator on either side of said moveable flux concentrator;

means on said base structure for supporting said stationary flux concentrators and said movable flux concentrators and enabling each of said movable flux concentrators to assume repetitive movement;

a pair of complementary electrodes on each moveable flux concentrator including a first electrode attached to said base structure in opposition to a corresponding second electrode that is attached to said moveable flux concentrator such that when said pair of complementary electrodes are excited by a modulating electrical signal, each moveable flux concentrator moves at a prescribed frequency to modulate the magnetic field at the magnetic sensors and shift the frequency of the magnetic field that is sensed by the magnetic sensors to a higher frequency to thereby minimize 1/f-type noise, where f is the frequency of operation of the magnetic sensor.

17. A microelectromechanical modulating magnetic field transducer comprising:

a base structure;

a magnetic sensor attached to said base structure;

a plurality of moveable flux concentrators on either side of said magnetic sensor;

a plurality of stationary flux concentrators on either side of said magnetic sensor;

means on said base structure for supporting said stationary flux concentrators and said movable flux concentrators and enabling each of said movable flux concentrators to assume repetitive movement;

a pair of complementary electrodes for each moveable flux concentrator including a first electrode attached to said base structure in opposition to a corresponding second electrode that is attached to said moveable flux concentrator such that when said pair of complementary electrodes are excited by a modulating electrical signal, each moveable flux concentrator moves at a prescribed frequency to modulate the magnetic field at the magnetic sensors and shift the frequency of the magnetic field that is sensed by the magnetic sensors to a higher frequency to thereby minimize 1/f-type noise, where f is the frequency of operation of the magnetic sensor.

18. A microelectromechanical modulating magnetic field transducer comprising:

a base structure;

a magnetic sensor attached to said base structure;

a plurality of moveable flux concentrators on either side of said magnetic sensor;

a stationary flux concentrator below said magnetic sensor;

means on said base structure for supporting said stationary flux concentrator and said movable flux concentrators and enabling each of said movable flux concentrators to assume repetitive movement;

a pair of complementary electrodes for each moveable flux concentrator including a first electrode attached to said base structure in opposition to a corresponding second electrode that is attached to said moveable flux concentrator such that when each said pair of complementary electrodes are excited by a modulating electrical signal, each moveable flux concentrator moves at a prescribed frequency to modulate the magnetic field at the magnetic sensors and shift the frequency of the magnetic field that is sensed by the magnetic sensors to a higher frequency to thereby minimize 1/f-type noise, where f is the frequency of operation of the magnetic sensor.

19. The modulating magnetic field transducer of claim 1 wherein:

said flux concentrator is repetitively movable into substantial alignment in a common plane with said magnetic sensor.

20. The modulating magnetic-field transducer of claim 19 further including:

another flux concentrator proximate to said magnetic sensor;

support means on said base structure for enabling said another flux concentrator to assume a repetitive movement;

another pair of complementary electrodes for said another flux concentrator including another first electrode attached to said base structure in opposition to another corresponding second electrode that is attached to said flux concentrator such that when said another pair of complementary electrodes are excited by a modulating electrical signal said another flux concentrator is repetitively movable into substantial alignment in a common plane with said flux concentrator and said magnetic sensor.

* * * * *